US012547079B2

(12) United States Patent
Jizaimaru et al.

(10) Patent No.: US 12,547,079 B2
(45) Date of Patent: Feb. 10, 2026

(54) RESIST STRIPPING METHOD, RESIST STRIPPING DEVICE, AND PRETREATMENT METHOD

(71) Applicants: NOMURA MICRO SCIENCE CO., LTD., Atsugi (JP); TOHOKU UNIVERSITY, Sendai (JP)

(72) Inventors: Takayuki Jizaimaru, Atsugi (JP); Takao Funakoshi, Atsugi (JP); Yasuyuki Shirai, Sendai (JP); Hisashi Fujimoto, Sendai (JP); Takeshi Sakai, Sendai (JP)

(73) Assignees: NOMURA MICRO SCIENCE CO., LTD., Atsugi (JP); TOHOKU UNIVERSITY, Sendai (JP)

( * ) Notice: Subject to any disclaimer, the term of this patent is extended or adjusted under 35 U.S.C. 154(b) by 612 days.

(21) Appl. No.: 18/076,657

(22) Filed: Dec. 7, 2022

(65) Prior Publication Data

US 2023/0101477 A1 Mar. 30, 2023

Related U.S. Application Data

(63) Continuation of application No. PCT/JP2021/023305, filed on Jun. 21, 2021.

(30) Foreign Application Priority Data

Aug. 28, 2020 (JP) ................. 2020-144073

(51) Int. Cl.
*G03F 7/00* (2006.01)
*G03F 7/38* (2006.01)
*G03F 7/42* (2006.01)

(52) U.S. Cl.
CPC ............... *G03F 7/422* (2013.01); *G03F 7/38* (2013.01)

(58) Field of Classification Search
CPC . G03F 7/422; G03F 7/38; G03F 7/427; G03F 7/42; H01L 21/027; H01L 21/304; H01L 21/31127; H01L 21/6715
(Continued)

(56) References Cited

U.S. PATENT DOCUMENTS

| 6,699,330 B1* | 3/2004 | Muraoka | C11D 3/3947 134/28 |
| 2004/0099284 A1* | 5/2004 | Miki | B08B 3/00 134/198 |
| 2015/0168843 A1* | 6/2015 | Cooper | C11D 3/042 510/176 |

FOREIGN PATENT DOCUMENTS

| JP | 2002134401 A | * 5/2002 | ........... H01L 21/027 |
| JP | 2004-88065 A | 3/2004 | |

(Continued)

OTHER PUBLICATIONS

International Search Report dated Aug. 24, 2021, issued in counterpart International Application No. PCT/JP2021/023305 (4 pages).
(Continued)

*Primary Examiner* — Eisa B Elhilo
(74) *Attorney, Agent, or Firm* — WHDA, LLP

(57) ABSTRACT

Provided is a stripping method capable of stripping a resist while suppressing the time and cost of processing required for stripping, while giving sufficient consideration to the load on the environment. The resist stripping method is a method for stripping a resist film-formed on a substrate, including: a pretreatment step of exposing the resist to a heated steam in a predetermined temperature range for a predetermined time; and a stripping step of stripping the resist exposed to the heated steam in the pretreatment step by using a resist stripping liquid, wherein the predetermined temperature range and the predetermined time are set according to the resist.

7 Claims, 5 Drawing Sheets

(58) Field of Classification Search
USPC .......................................................... 510/176
See application file for complete search history.

(56) References Cited

FOREIGN PATENT DOCUMENTS

| | | | | | |
|---|---|---|---|---|---|
| JP | 2004104090 | A | * | 4/2004 | ............... C11D 7/04 |
| JP | 2009231466 | A | * | 10/2009 | ........... H01L 21/304 |
| JP | 2010087419 | A | * | 4/2010 | ........... H01L 21/027 |
| JP | 2010-118681 | A | | 5/2010 | |
| KR | 20010109267 | A | * | 12/2001 | ............. G03F 7/427 |
| WO | WO 2010090146 | A1 | * | 8/2010 | ............... C11D 7/50 |
| WO | WO 2019212037 | A1 | * | 11/2019 | ............... G03F 7/42 |

OTHER PUBLICATIONS

Notice of Reasons for Refusal dated Jun. 8, 2022, issued in counterpart JP Patent Application No. 2020-144073, w/ English translation (10 pages).

* cited by examiner

RESIST STRIPPING METHOD, RESIST STRIPPING DEVICE, AND PRETREATMENT METHOD

CROSS-REFERENCE TO RELATED APPLICATIONS

The present application is a continuation application of International application No. PCT/JP2021/023305 filed on Jun. 21, 2021, which is based upon and claims the benefit of priority from the prior Japanese Patent Application No. 2020-144073 filed on Aug. 28, 2020; the entire contents of these applications are incorporated herein by reference.

BACKGROUND OF THE INVENTION

Field of the Invention

The present invention relates to a resist stripping method, a resist stripping device, and a pretreatment method using a resist stripping liquid (resist remover) having little environmental load.

Description of the Related Art

In manufacturing processes of a semiconductor substrate, a liquid crystal display, an organic EL display or the like, fine patterns are formed by using a resist. As the resist, an organic substance such as a novolak resin is used. In recent years, as electronic materials have become finer and more functional, manufacturing processes such as ion implantation into resists have become more complicated, and more time and cost have been spent on stripping or removing resists the hardness of which has been enhanced by ion implantation.

The resist is removed by using sulfuric acid and hydrogen peroxide aqueous solution or amine type resist stripping agent, and then cleaning is performed by ammonia and hydrogen peroxide aqueous solution. In such a process, a large amount of chemical liquid is used, and a large amount of cost and time are required to treat the waste liquid, which is not favorable in terms of environmental load.

Considering the above, there has been proposed a stripping method that uses ozone water with relatively small environmental load. Since the removal rate of the stripping using ozone water is low, the use of heated ozone water is examined; however, heated ozone water of high concentration is difficult to obtain because the ozone concentration in the ozone water decreases with a rise in temperature. In order to solve this problem, the manufacturing method of heated ozone water described in Patent Document 1 dissolves ozone gas in pure water adjusted to a pH of 3 or less by adding an acid, and heats the water to 60° C. or more.

There has also been proposed a method of stripping a resist film by utilizing a physical property change of the resist by water vapor, e.g., softening, expansion, hydration, swelling, and solidification, among others. The resist film removing device described in Patent Document 2 injects saturated steam or heated steam to the resist film to remove the resist film by utilizing the action of the steam.

SUMMARY OF INVENTION

In order to solve the above problem, a resist stripping method according to the present invention is a method for stripping a resist film-formed on a substrate, including: a pretreatment step of exposing the resist to a heated steam in a predetermined temperature range for a predetermined time; and a stripping step of stripping the resist exposed to the heated steam in the pretreatment step by using a resist stripping liquid, wherein the predetermined temperature range and the predetermined time are set according to the resist.

In the resist stripping method of the present invention, the resist is preferably an ion-implanted resist.

In the resist stripping method of the present invention, the resist stripping liquid is preferably ozone water adjusted to a predetermined range of pH.

A resist stripping device according to the present invention is an device for stripping a resist film-formed on a substrate, including: a heated steam generating unit for generating heated steam; a steam supply unit for exposing the resist to the heated steam for a predetermined time; a temperature control unit for setting the heated steam for exposing the resist to a predetermined temperature range; a time control unit for controlling the predetermined time; and an ozone water treatment device for performing a stripping of the resist exposed to the heated steam by the steam supply unit by using a resist stripping liquid, wherein the predetermined temperature range and the predetermined time are set according to the resist.

A pretreatment according to the present invention is a treatment conducted immediately before stripping a resist film-formed on a substrate from the substrate by using ozone water in a predetermined concentration range, including: a heated steam generation step of generating heated steam; and a heated steam supply step of exposing the resist to the heated steam for a predetermined time, wherein the heated steam to which the resist is exposed is controlled to a predetermined temperature range by a temperature control unit, and wherein the predetermined temperature range and the predetermined time are set according to the resist.

DETAILED DESCRIPTION OF THE INVENTION

Hereinafter, a resist stripping method, a resist stripping device, and a pretreatment method according to an embodiment of the present invention will be described in detail with reference to the drawings. The resist stripping method of the present embodiment is carried out by using a resist stripping device 10 illustrated in FIG. 1.

Figure 1:
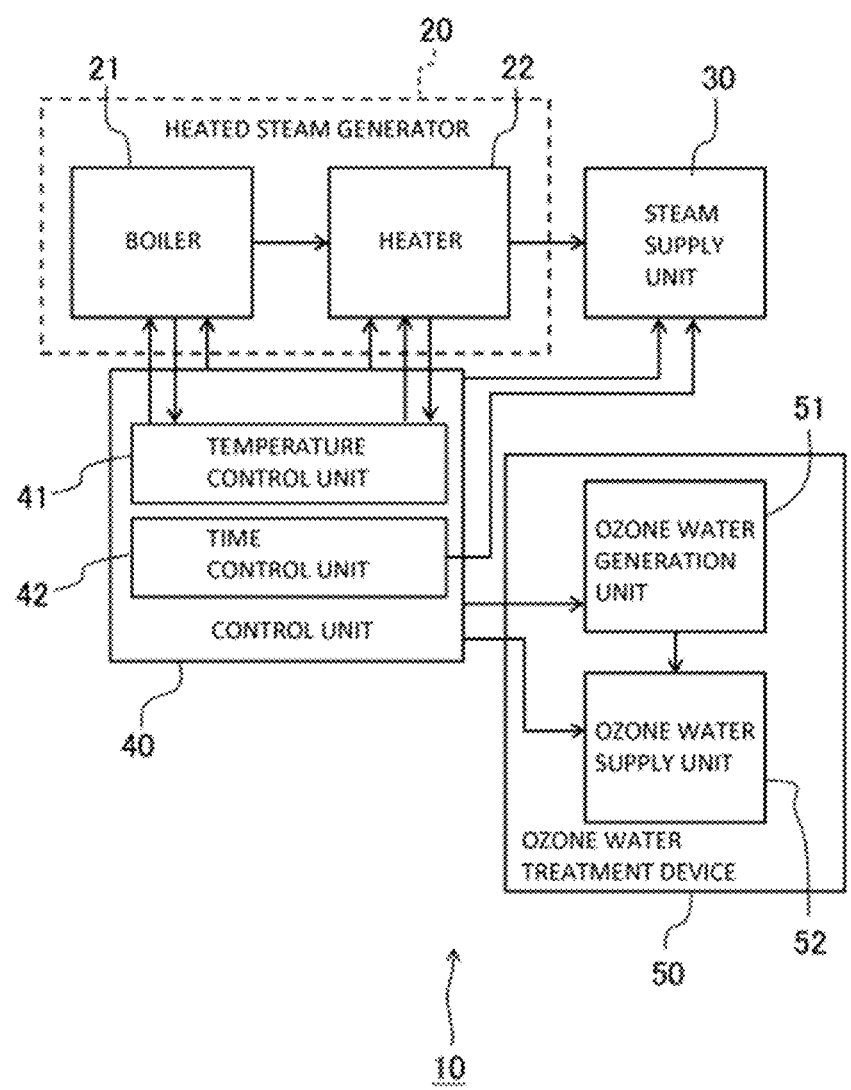
FIG. 1 is a block diagram illustrating a configuration of a resist stripping device according to an embodiment of the present invention.

The resist stripping device 10 shown in FIG. 1 includes a heated steam generator 20 (a heated steam generating unit), a steam supply unit 30 (a steam supplier), a control unit 40, and an ozone water treatment device 50. Among these, the heated steam generator 20, the steam supply unit 30, and the control unit 40 constitute a pretreatment device used for pretreatment conducted immediately before the stripping of the resist using ozone water.

The heated steam generator 20 generates high-temperature and high-pressure steam in a boiler 21, and heats the steam further to a predetermined temperature range of a saturation temperature or higher by a heater 22 to form heated steam. The predetermined temperature range is set on the basis of the physical properties, film thickness, and other film formation conditions of the resist to be film-formed on the substrate, as well as the type, amount and other implantation conditions of ions implanted into the resist. The heated steam generated by the heater 22 is supplied to a predetermined range on the substrate by the steam supply unit 30. Here, the amount of ions implanted in the ion implantation process for the resist is, e.g., $10^{14}$ ions/cm$^2$ or more.

The boiler 21 may be a heater, a furnace, or a known boiler, and the heater 22 may be various heaters such as a ribbon heater, a double tube type heat exchanger, a plate type heat exchanger as well as a configuration in which steam flowing through a metallic pipe line is heated by a burner or an alcohol lamp.

The steam supply unit 30 has a structure capable of adjusting the exposure conditions of the heated steam to the substrate, e.g., the range of discharge (exposure), the discharge speed (pressure), and the discharge time. The steam supply unit 30 may be configured as a discharge port of heated steam from the heater 22. In this case, discharge conditions to the substrate can be set depending on the inner diameter size of the conduit, the shape of the conduit outlet, and the configuration of the valve provided at the conduit outlet, among other factors. Although the supply form of the heated steam from the steam supply unit 30 is not particularly limited, blowing the steam with a nozzle will facilitate control of blowing range and speed.

Heating in the boiler 21 and heating in the heater 22 are controlled by a temperature control unit 41 of the control unit 40, and heated steam in a predetermined temperature range is generated by this control.

The supply time of the heated steam from the steam supply unit 30 is controlled by a time control unit 42 of the control unit 40. The discharge range and the discharge speed (pressure) of the heated steam to the substrate are set to predetermined ranges by the control unit 40 controlling at least the steam supply unit 30 of the heater 22 and the steam supply unit 30. The time (predetermined time) during which the heated steam is supplied from the steam supply unit 30 to the substrate is set on the basis of the temperature of the heated steam, the physical properties of the resist to be film-formed on the substrate, the film thickness and other film formation conditions, as well as the type, amount, and other implantation conditions of ions implanted into this resist.

The gas heated by the heated steam generator 20 is preferably water vapor steam. This is because water vapor is significantly more effective than other gases. Since the specific heat of water vapor is higher than that of a general gas, e.g., nitrogen, the resist on the substrate can be rapidly heated, and thus cracks are likely to be generated in the resist; in addition, it is expected that penetration of water vapor into resist and catalysis action by water vapor will promote crack generation.

The control unit 40 controls the operation of the ozone water treatment device 50 in addition to the generation and supply of the heated steam. The ozone water treatment device 50 is provided with an ozone water generation unit 51 for generating ozone water having a pH (hydrogen ion exponent) in a predetermined range and a concentration in a predetermined range, and an ozone water supply unit 52 for supplying the ozone water generated in the ozone water generation unit 51 to a substrate after being exposed to heated steam.

In the ozone water generation unit 51, ozone water having a concentration in a predetermined range is generated by a known procedure, the pH of the ozone water being adjusted in a predetermined range by adding an additive e.g., carbonic acid, citric acid, acetic acid, hydrochloric acid, sulfuric acid or the like. The pH is preferably 4 to 5 when carbonic acid is used. The pH is preferably 1.5 to 5, more preferably 2 to 3 when citric acid, acetic acid, hydrochloric acid, sulfuric acid or the like is used. The concentration of the ozone water is, e.g., 100 to 250 ppm at ordinary temperature in the case of carbon dioxide. The concentration of the ozone water is, 200 to 600 ppm at ordinary temperature and 100 to 250 ppm at 80° C. in the case of citric acid, acetic acid, hydrochloric acid, sulfuric acid or the like.

Although examples of the resist stripping liquid used for the resist stripping after the pretreatment may include ozone water as well as an aqueous or non-aqueous resist stripping liquid such as an existing amine resist stripping liquid or an alkylene carbonate resist stripping liquid, ozone water is preferably used from the viewpoint of the stripping property of the resist and the reduction of environmental load.

Figure 2:
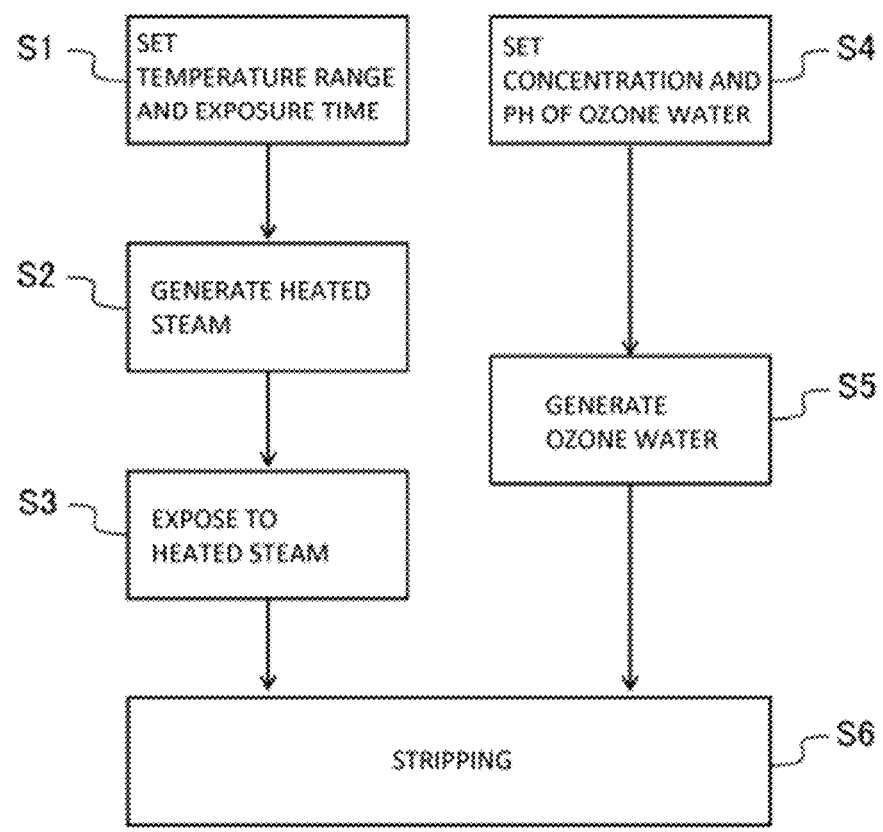
FIG. 2 is a flowchart illustrating a procedure of a resist stripping method according to an embodiment of the present invention.

The resist stripping method using the resist stripping device 10 is performed according to the procedure illustrated in FIG. 2.

As the initial setting of the heated steam supply, the control unit 40 sets the temperature range of the heated steam generated by the heated steam generator 20 and the exposure time to the substrate with the heated steam supplied from the steam supply unit 30 (step S1).

The control unit 40 controls the temperature control unit 41 so as to control the temperature to be within the range set in step S1, and this control causes the temperature control unit 41 to operate the boiler 21 and the heater 22 to generate heated steam (step S2, heated steam generation step).

The generated heated steam is supplied from the steam supply unit 30 such that the substrate is exposed to the heated steam for a predetermined time designated by the time control unit 42 (step S3, pretreatment step and heated steam supply step). At this time, the supply conditions other than the time are controlled by the control unit 40.

On the other hand, as the initial setting of the ozone water treatment, the control unit 40 sets the concentration and pH of the ozone water to be generated by the ozone water treatment device 50 (step S4). The control unit 40 controls the ozone water generation unit 51 so as to generate ozone water having the concentration and pH set in the step S4 (step S5).

By using the ozone water generated in the step S3, the substrate exposed to the heated steam in the step S3 is subjected to the stripping of the film-formed resist (step S6, stripping step).

There are optimum conditions for pretreatment by exposure to heated steam. For example, a pretreatment for a period longer than a certain period of time (predetermined period of time) will change the resist property, which will make it difficult to strip the resist in the subsequent stripping process. In addition, a temperature of the heated steam higher than a certain range (a predetermined temperature range) also makes the stripping difficult depending on the width of the resist in the subsequent stripping.

The optimum conditions for the pretreatment vary depending on the type (physical properties) and film thickness of the resist, and the amount and type of ions implanted into the resist, among other factors; in the following examples, the temperature was 200 to 350° C., the supply time was 1 to less than 60 seconds, preferably 3 to less than 30 seconds, and even more preferably 5 to less than 30 seconds. Preferable pretreatment will generate cracks in the resist, so that the resist stripping liquid (e.g., ozone water) easily penetrates into the resist or between the resist and the substrate through the cracks in the stripping using ozone water to be carried out thereafter. Thus, the resist is easily stripped from the substrate, and the stripping process can be performed quickly. Since the stripping property is most remarkably improved when ozone water is used as the resist stripping agent, it is presumed that ozone water is most likely to penetrate through the cracks.

When the pretreatment is performed under the above optimum conditions, the resist can be removed regardless of the width. On the other hand, it is sometimes difficult for the conventional stripping method to completely strip a wide resist disposed at a corner of a substrate, and in such a case, a method called ashing is sometimes adopted in which a plasma of a reactive gas such as oxygen plasma is generated and the resist is decomposed into carbon dioxide and water to be removed.

However, ashing has the following problems: (1) generating plasma causes a chemical or physical change in the substrate; (2) a decomposed product remains on the substrate; (3) equipment for generating plasma is expensive; and (4) the size and arrangement of other devices are limited by the space occupied by the plasma generating equipment. On the contrary, in the resist stripping device 10 of the present embodiment, it is possible to reliably strip various widths of resist without causing such a problem. In other words, the use of the present invention makes it possible not to perform the ashing itself or to greatly relax the ashing condition, thereby minimizing adverse effects on the substrate during the ashing.

Here, when performing the pretreatment under conditions other than the above-described optimum conditions, cracks might not be generated in the resist, with the resist just being wrinkled. In such a case, since the resist stripping liquid does not penetrate into the inside of the resist or between the resist and the substrate, stripping is only observed in a range, e.g., where the resist stripping liquid penetrates from the resist surface, but a considerable time is required for complete stripping of the resist.

Further, when the pretreatment is performed under conditions other than the above-described optimum conditions, such as when the pretreatment time is too long, there is a case where the resist is cracked but cured in that state, and in such a case, it is difficult to remove the resist in the subsequent stripping process.

Figure 3:
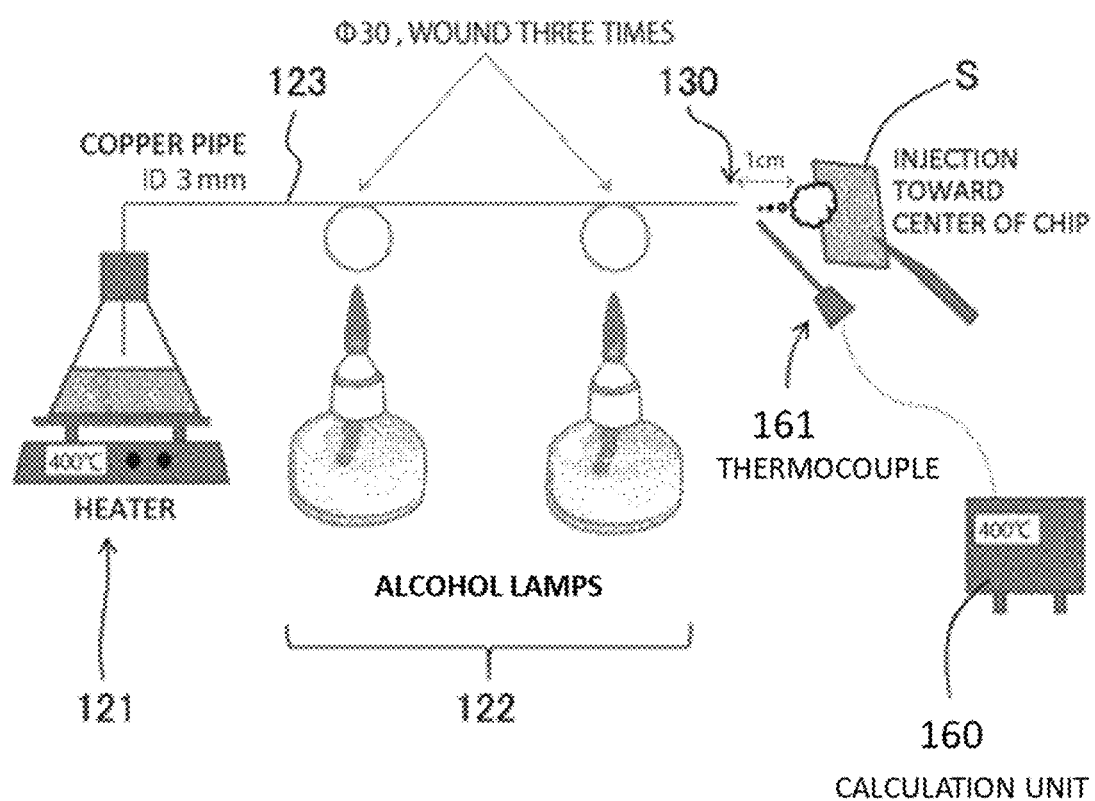
FIG. 3 is a diagram illustrating a schematic configuration of a heated steam generator and a steam supply unit in an example.

Examples of the above embodiment will be described below. In Examples, the device shown in FIG. 3 is used as the heated steam generator 20 and the steam supply unit 30 of the resist stripping device 10. In the device shown in FIG. 3, an electrothermal heater 121 and two alcohol lamps 122 are provided as the boiler 21 and the heater 22 in the resist stripping device 10.

The steam generated by the heater 121 flows through a copper pipe 123 having an inner diameter of 3 mm, and is injected to the chip S from a nozzle outlet 130 provided in the vicinity of the chip S as a target of pretreatment. The copper pipe 123 is wound three times on a 30 mm diameter coil at each of the positions above the two alcohol lamps 122 and is disposed so as to be close to the corresponding alcohol lamps 122 at each position. With this arrangement, the steam flowing in the copper pipe 123 is heated.

A thermocouple 161 capable of measuring the temperature of the injected heated steam is arranged in the vicinity of the nozzle outlet 130 corresponding to the steam supply unit 30 of the resist stripping device 10, and the temperature is calculated in a calculation unit 160 on the basis of the detection result by the thermocouple 161.

Experimental conditions in Examples or Comparative Examples are as follows.

Chip S (target): a wafer (substrate) coated with a resist (product name: TDUR-P 3116 EM, positive photoresist for KrF excimer laser manufactured by TOKYO OHKA KOGYO CO., LTD.) was implanted with $2\times10^{15}$ arsenic (As) ions/$cm^2$ by using $AsH_3$ gas. The horizontal size of the chip is 2 cm×2 cm.

The heated steam treatment was carried out at a heated steam outlet flow rate of 10 to 20 L/min (200 to 400° C., 1 atm). The gas flow rate was calculated by the decrease in water in the beaker heated by the heater 121.

In the nitrogen treatment in Comparative Example 2, instead of the heater 121, a nitrogen cylinder was connected to the copper pipe 123 through a pressure reducing valve, and a flowmeter was connected to the copper pipe 123 to supply nitrogen while measuring a flow rate.

Ozone water treatment: ozone water for resist stripping was produced using an ozone water production device NOMUREXON NOM-5-150 manufactured by Nomura Micro Science Co., Ltd. This ozone water was supplied at a pH of 2.5 by adding citric acid, a temperature of 80° C., a concentration of 200 ppm, and a flow rate of 1 L/min.

The conditions for pretreatment with the heated gas are as shown in Table 1 below. The temperature in Table 1 is the temperature of the gas injected and exposed to the chip S, measured by using the thermocouple 161, and the time is the time from the start to the end of the injection.

Figure 4A:
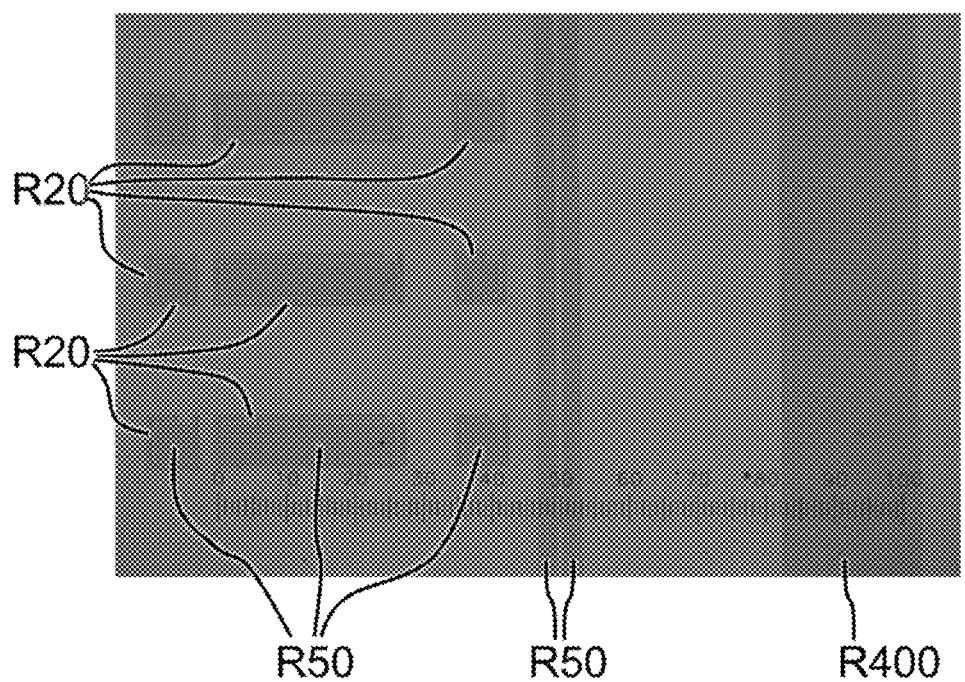
FIG. 4A is a photograph showing a state before the chip as a target is pretreated in Example 2.

On the chip S, as shown in FIG. 4A, there is formed a linear resist having a fixed width or a distance between the wirings. Specifically, a resist R20 having a width of 20 μm, a resist R50 having a width of 50 μm, and a resist R400 having a width of 400 μm are formed.

Symbols A to D in Table 1 indicate the following evaluation results of resist stripping and removal.

A: The resists having a width of 20 μm, 50 μm, and 400 μm were all removed.

B: The resists having a width of 20 μm and 50 μm were removed. With regard to the resist having a width of 400 μm, a part of the resist remains, but almost all of the resist can be removed without any practical problems.

C: The resists having a width of 20 μm and 50 μm were removed, but the resist having a width of 400 μm could not be removed.

D: The resist having a width of 20 μm was removed, but the resists having a width of 50 μm and 400 μm could not be removed.

E: Any resist having a width of 20 μm, 50 μm, and 400 μm could not be removed.

Examples of the generation of cracks in the resist in the pretreatment and the stripping of the resist in the ozone water treatment will be described with reference to FIGS.

4A, 4B, 5A and 5B corresponding to Example 2. FIGS. 4A, 4B, 5A, and 5B are photomicrographs, and the scale shown in each figure indicates numerical values in mm units.

Figure 4B:
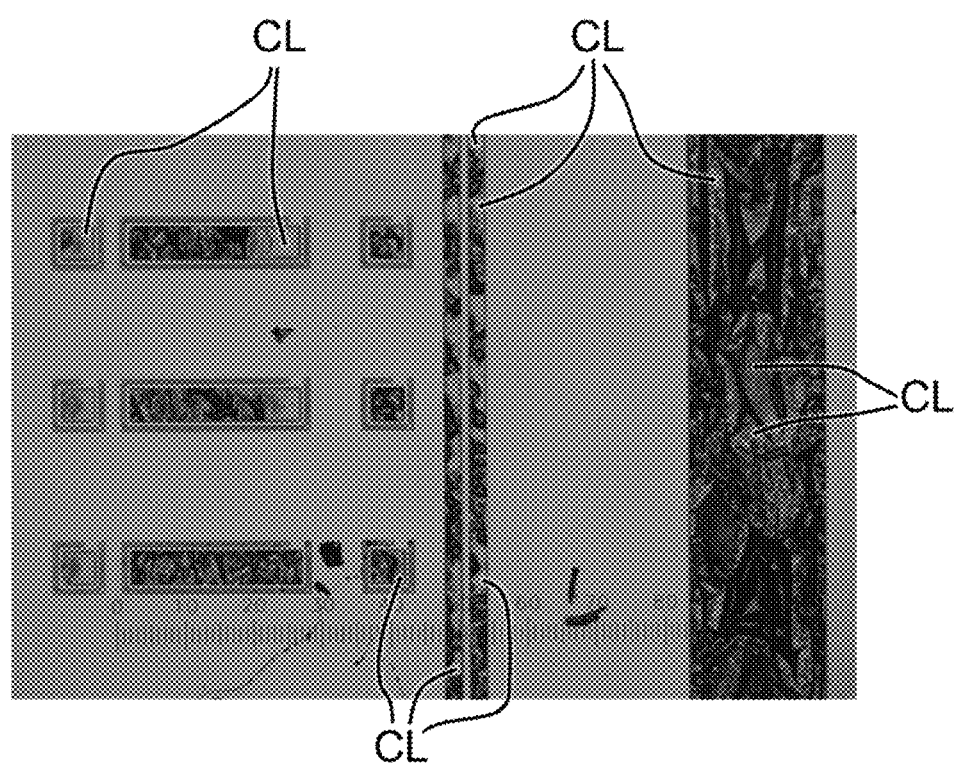
FIG. 4B is a photograph showing a state after the chip in the state shown in FIG. 4A is pretreated.

FIG. 4B shows a state after heated steam at 300° C. is injected and exposed for 10 seconds to a chip on which a resist is formed as shown in FIG. 4A. As shown in FIG. 4B, a white crack CL is formed in a part of the black resist.

Figure 5A:
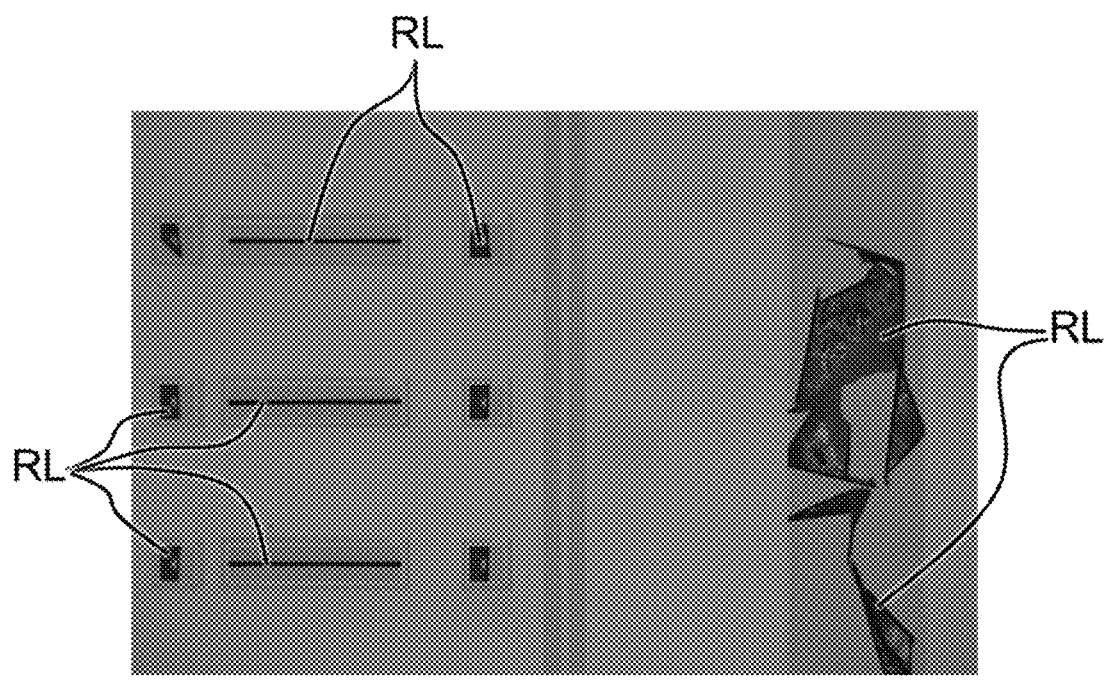
FIG. 5A is a photograph showing a state five minutes after the resist stripping process is started for the chip in the state shown in FIG. 4B

FIG. 5A shows a state in the middle of supplying ozone water of pH 2.5, temperature 80° C., and concentration 200 ppm at a flow rate of 1 L/min to the chip of FIG. 4B (a state after 5 minutes). As shown in FIG. 5A, while the resist R20 having a width of 20 μm and the resist R50 having a width of 50 μm have been removed, it can be seen that a strip-shaped black resist RL remains in a part of the resist R400 having a width of 400 μm. This state corresponds to B of the above evaluations A to E.

Figure 5B:
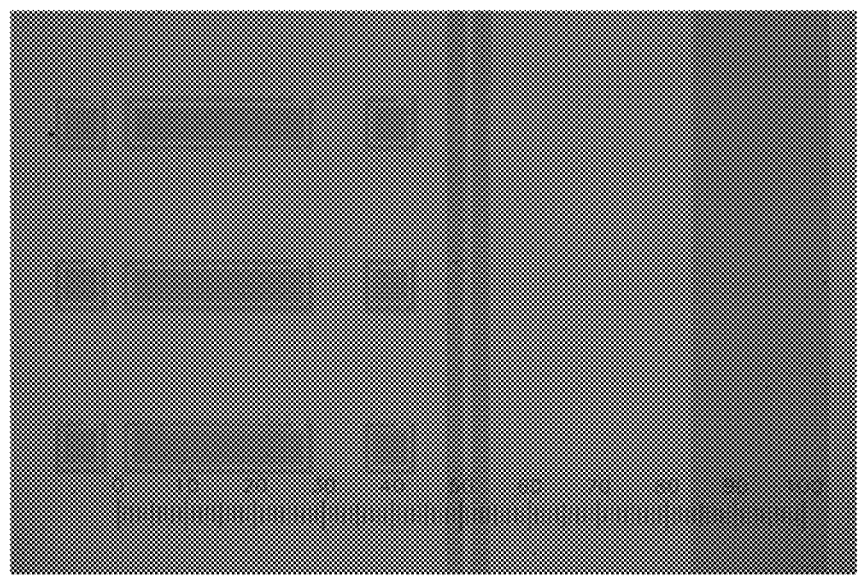
FIG. 5B is a photograph showing a state ten minutes or more after the start of the resist stripping process while further continuing the resist stripping process from the state shown in FIG. 4A.

FIG. 5B shows a state in which ozone water is further supplied from the state shown in FIG. 5A and 10 minutes or more have passed since the start of supply. As shown in FIG. 5B, all the resists having a width of 20 μm, 50 μm, and a width of 400 μm are completely stripped and removed. This state corresponds to A of the above evaluations A to E.

Next, Examples and Comparative Examples will be described with reference to Table 1.

As shown in Table 1, in Examples 1 to 3, the results were evaluated as A by the ozone water treatment time of 60 minutes, and it can be seen that the resist having the widths of 20, 50, and 400 μm can be stripped and removed.

On the other hand, in Comparative Examples 1 to 6, the results were not evaluated as A within a practical time range of 60 minutes, and it can be seen that the resist has not been stripped and removed.

With the comparison between Examples 1 to 3 and Comparative Examples 1 to 6, it is understood that water vapor is preferable as the gas used in the pretreatment, and that the pretreatment at a heating temperature of 200 or 300° C. and a time of 10 or 20 seconds can surely strip and remove the resist regardless of its width within a practical time in the subsequent ozone water treatment. With further comparison, it was found that the heating temperature range not less than 200 and not more than 350° C. and the time range not less than 5 and not more than 30 seconds could achieve an excellent effect of resist stripping and removal, which was not achieved in Comparative Examples 1 to 6. It was revealed that the method of the present application can suitably strip a highly ion-implanted resist.

Although the present invention has been described with reference to the above-described embodiments, the present invention is not limited thereto and may be improved or modified for the purpose of improvement or within the scope of the concept of the present invention.

According to the present invention, resist can be stripped without depending on the width or the film formation portion, while sufficiently considering the load on the environment and suppressing the time and cost of the processing required for stripping.

What is claimed is:

1. A resist stripping method for stripping a resist film-formed on a substrate, comprising:
   a pretreatment step of exposing the resist to a heated steam in a predetermined temperature range for a predetermined time; and
   a stripping step of stripping the resist exposed to the heated steam in the pretreatment step by using a resist stripping liquid,
   wherein the predetermined temperature range and the predetermined time are set according to the resist, and
   wherein the heated steam is water vapor steam.

2. The resist stripping method according to claim 1, wherein the resist is an ion-implanted resist.

3. The resist stripping method according to claim 1, wherein the resist stripping liquid is ozone water adjusted to a predetermined range of pH.

4. The resist stripping method according to claim 2, wherein the resist stripping liquid is ozone water adjusted to a predetermined range of pH.

5. A pretreatment method conducted immediately before stripping a resist film-formed on a substrate from the substrate by using ozone water in a predetermined concentration range, comprising:
   a heated steam generation step of generating heated steam; and
   a heated steam supply step of exposing the resist to the heated steam for a predetermined time,
   wherein the heated steam to which the resist is exposed is controlled to a predetermined temperature range by a temperature control unit, and
   wherein the predetermined temperature range and the predetermined time are set according to the resist, and
   wherein the heated steam is water vapor steam.

6. The resist stripping method according to claim 1, wherein the predetermined temperature range is from 200° C. or more and 300° C. or less.

TABLE 1

| | pretreatment with heated steam | | | ozone water process time | | | | |
|---|---|---|---|---|---|---|---|---|
| | process gas | temperature (° C.) | time (sec) | 0 min | 5 min | 10 min | 20 min | 60 min |
| Ex. 1 | water vapor | 200 | 20 | | C | B | B | A |
| Ex. 2 | water vapor | 300 | 10 | | B | A | A | A |
| Ex. 3 | water vapor | 300 | 20 | | C | C | B | A |
| Comp. 1 | none | ordinary temperature | 0 | | D | C | C | B |
| Comp. 2 | nitrogen | 300 | 10 | | D | C | C | B |
| Comp. 3 | water vapor | 300 | 60 | | D | D | D | D |
| Comp. 4 | water vapor | 400 | 10 | | D | D | D | D |
| Comp. 5 | water vapor | 300 | 600 | E | | | | |
| Comp. 6 | water vapor | 400 | 600 | E | | | | |

7. The resist stripping method according to claim 1, wherein the predetermined temperature range and the predetermined time in the pretreatment step are performed to generate cracks in the resist.

\* \* \* \* \*